United States Patent
Hong et al.

(10) Patent No.: US 12,431,187 B2
(45) Date of Patent: Sep. 30, 2025

(54) PRE-CHARGE CONTROL CIRCUIT AND VOLTAGE GENERATION CIRCUIT INCLUDING THE SAME

(71) Applicant: SK hynix Inc., Icheon-si (KR)

(72) Inventors: Jae Hyeong Hong, Icheon-si (KR); In Seok Kong, Icheon-si (KR); Bon Kwang Koo, Icheon-si (KR); Gwan Woo Kim, Icheon-si (KR); Heon Ki Kim, Icheon-si (KR); Beom Kyu Seo, Icheon-si (KR); Keun Seon Ahn, Icheon-si (KR); Soon Sung An, Icheon-si (KR); Sung Hwa Ok, Icheon-si (KR); Jung Yeop Lee, Icheon-si (KR); Ji Young Lee, Icheon-si (KR); Dong Wook Jang, Icheon-si (KR); Jun Seo Jang, Icheon-si (KR); Sun Ki Cho, Icheon-si (KR); Eun Ji Choi, Icheon-si (KR)

(73) Assignee: SK hynix Inc., Icheon-si (KR)

(*) Notice: Subject to any disclaimer, the term of this patent is extended or adjusted under 35 U.S.C. 154(b) by 225 days.

(21) Appl. No.: 18/454,449

(22) Filed: Aug. 23, 2023

(65) Prior Publication Data
US 2024/0355376 A1    Oct. 24, 2024

(51) Int. Cl.
  *G11C 13/04* (2006.01)
  *G11C 11/4074* (2006.01)
  *G11C 16/26* (2006.01)
(52) U.S. Cl.
  CPC .......... *G11C 11/4074* (2013.01); *G11C 16/26* (2013.01)

(58) Field of Classification Search
  CPC ....... G11C 5/147; G11C 5/14; G11C 11/4074; G11C 16/30; G11C 5/143
  USPC ....................................................... 365/226
  See application file for complete search history.

(56) References Cited

U.S. PATENT DOCUMENTS

| | | |
|---|---|---|
| 11,264,097 B2 | 3/2022 | Jeong |
| 2004/0027904 A1* | 2/2004 | Morikawa ............... G11C 7/062 365/222 |

OTHER PUBLICATIONS

Moosung Kim et al., A 1Tb 3b/Cell 8th-Generation 3D-NAND Flash Memory with 164MB/s Write Throughput and a 2.4Gb/s Interface, 2022 IEEE International Solid- State Circuits Conference (ISSCC), San Francisco, CA, USA,. Feb. 20-26, 2022, pp. 136-137.

* cited by examiner

*Primary Examiner* — Son T Dinh
(74) *Attorney, Agent, or Firm* — WILLIAM PARK AND ASSOCIATES LTD.

(57) ABSTRACT

A voltage generation circuit includes a voltage generation unit configured to generate a reference voltage using a power supply voltage and output the reference voltage through a voltage output node. The voltage generation circuit also includes a pre-charge unit configured to drive the voltage output node using the power supply voltage in response to a pre-charge control signal. The voltage generation circuit further includes a pre-charge control unit configured to generate at least one sampling voltage using the power supply voltage and generate the pre-charge control signal according to a result obtained by comparing the at least one sampling voltage with the reference voltage.

18 Claims, 7 Drawing Sheets

FIG. 7

|  | ENPCG | SELVTERM<1> | SELVTERM<0> | ENOPT2 |
|---|---|---|---|---|
| VREFHTT | 1 | 1 | Don't Care | Don't Care |
| VREFCTT | 1 | 0 | 1 | Don't Care |
| VREFLTT | 1 | 0 | 0 | Don't Care |
| VSSI | 0 | Don't Care | Don't Care | 0 |
| VCCQ | 0 | Don't Care | Don't Care | 1 |

PRE-CHARGE CONTROL CIRCUIT AND VOLTAGE GENERATION CIRCUIT INCLUDING THE SAME

CROSS-REFERENCES TO RELATED APPLICATION

The present application claims priority under 35 U.S.C. § 119 (a) to Korean application number 10-2023-0053391, filed on Apr. 24, 2023, in the Korean Intellectual Property Office, which is incorporated herein by reference in its entirety.

BACKGROUND

1. Technical Field

The present technology relates to a semiconductor circuit, and more particularly, to a pre-charge control circuit and a voltage generation circuit including the same.

2. Related Art

In a semiconductor device, particularly a semiconductor memory device, an internal voltage is generated from an external voltage applied from outside of the semiconductor memory device for low power and stable operation, and the internal voltage is used as a voltage supply source for circuits inside a chip.

For desirable operation of the semiconductor device, the internal voltage that can be used as the voltage supply source of internal circuits has to be generated as an accurate and stable voltage. However, because hundreds of processes are required to produce one semiconductor device, and each of the processes cannot always proceed consistently, a defect occurs in the chip when a level of the internal voltage differs from a level set as a design target value. Accordingly, to adjust the level of the internal voltage, which is changed by variations in process, to the design target value, the semiconductor memory device generates the internal voltage on the basis of a voltage having a stable level with respect to the variations in process, that is, a reference voltage. In addition, the reference voltage is used as not only a base voltage for generating the internal voltage but also a reference for determining a logic value (high or low) inside the semiconductor device. Therefore, it is very important for the semiconductor device to stably generate the reference voltage at a target level and rapidly set the reference voltage to the target level.

SUMMARY

A voltage generation circuit according to an embodiment of the present technology may include: a voltage generation unit configured to generate a reference voltage using a power supply voltage and output the reference voltage through a voltage output node; a pre-charge unit configured to drive the voltage output node using the power supply voltage in response to a pre-charge control signal; and a pre-charge control unit configured to generate at least one sampling voltage using the power supply voltage and generate the pre-charge control signal according to a result obtained by comparing the at least one sampling voltage with the reference voltage.

A voltage generation circuit according to an embodiment of the present technology may include: a voltage generation unit including a first voltage division circuit configured to divide a power supply voltage and generate a plurality of preliminary voltages, and configured to output one of the plurality of preliminary voltages as a reference voltage through a voltage output node according to a voltage generation control signal and a voltage control code; a control logic unit configured to generate a pre-charge control signal according to the voltage generation control signal and a comparison signal; a pre-charge unit configured to pre-charge the voltage output node to a power supply voltage level in response to the pre-charge control signal; a second voltage division circuit configured to divide the power supply voltage and generate at least one sampling voltage; and a comparator configured to compare the reference voltage with the at least one sampling voltage and generate the comparison signal A pre-charge control circuit according to an embodiment of the present technology may include: a pre-charge unit configured to pre-charge a voltage output node to which an internal voltage is applied with a power supply voltage in response to a pre-charge control signal; a control logic unit configured to generate a first preliminary pre-charge control signal according to a voltage generation control signal and generate the pre-charge control signal according to the voltage generation control signal, the first preliminary pre-charge control signal, and a comparison signal; a sampling voltage generation unit configured to divide the power supply voltage and generate at least one sampling voltage; and a comparator configured to compare the internal voltage with the at least one sampling voltage and generate the comparison signal

BRIEF DESCRIPTION OF THE DRAWINGS

FIG. 7 is a truth table for describing an operation of the pre-charge control unit illustrated in FIG. 6.

DETAILED DESCRIPTION

Various embodiments of the present technology are directed to a pre-charge control circuit capable of stably generating a voltage, and a voltage generation circuit including the pre-charge control circuit.

Hereinafter, embodiments of the present technology will be described in more detail with reference to the accompanying drawings.

Figure 1:
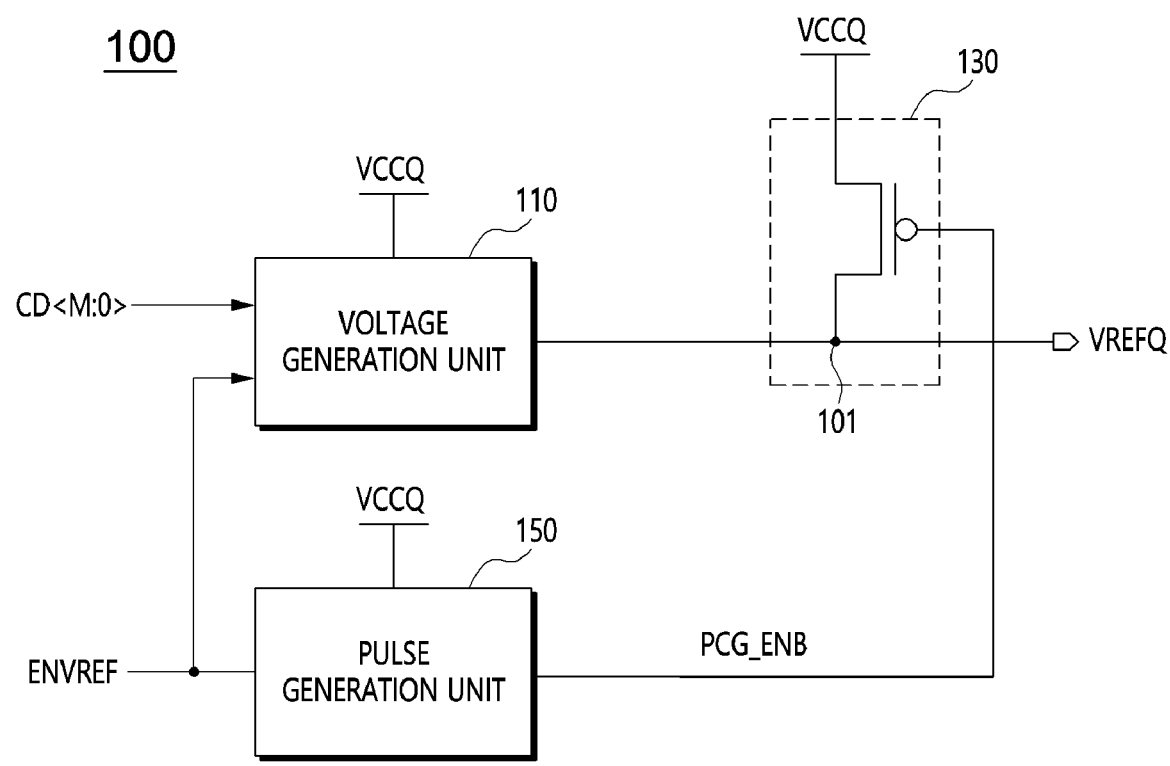
FIG. 1 is a diagram illustrating a configuration of a voltage generation circuit, according to an embodiment of the present technology.

FIG. 1 is a diagram illustrating a configuration of a voltage generation circuit 100, according to an embodiment of the present technology.

Referring to FIG. 1, the voltage generation circuit 100 according to the present embodiment may include a voltage generation unit 110, a pre-charge unit 130, and a pulse generation unit 150.

The voltage generation unit 110 may generate an internal voltage, which is a voltage used inside a semiconductor device, for example, a reference voltage VREFQ, in response to a power supply voltage VCCQ, a voltage generation control signal ENVREF, and voltage control codes CD<M:0>, and output the generated reference voltage VREFQ to a voltage output node 101.

The pre-charge unit 130 may pre-charge the voltage output node 101 to a power supply voltage VCCQ level in response to a pre-charge control signal PCG_ENB. The pre-charge unit 130 may be composed of a transistor having a source terminal to which the power supply voltage VCCQ is applied, a drain terminal connected to the voltage output node 101, and a gate terminal to which the pre-charge control signal PCG_ENB is inputted.

The pulse generation unit 150 may generate the pre-charge control signal PCG_ENB in response to the voltage generation control signal ENVREF.

Figure 2:
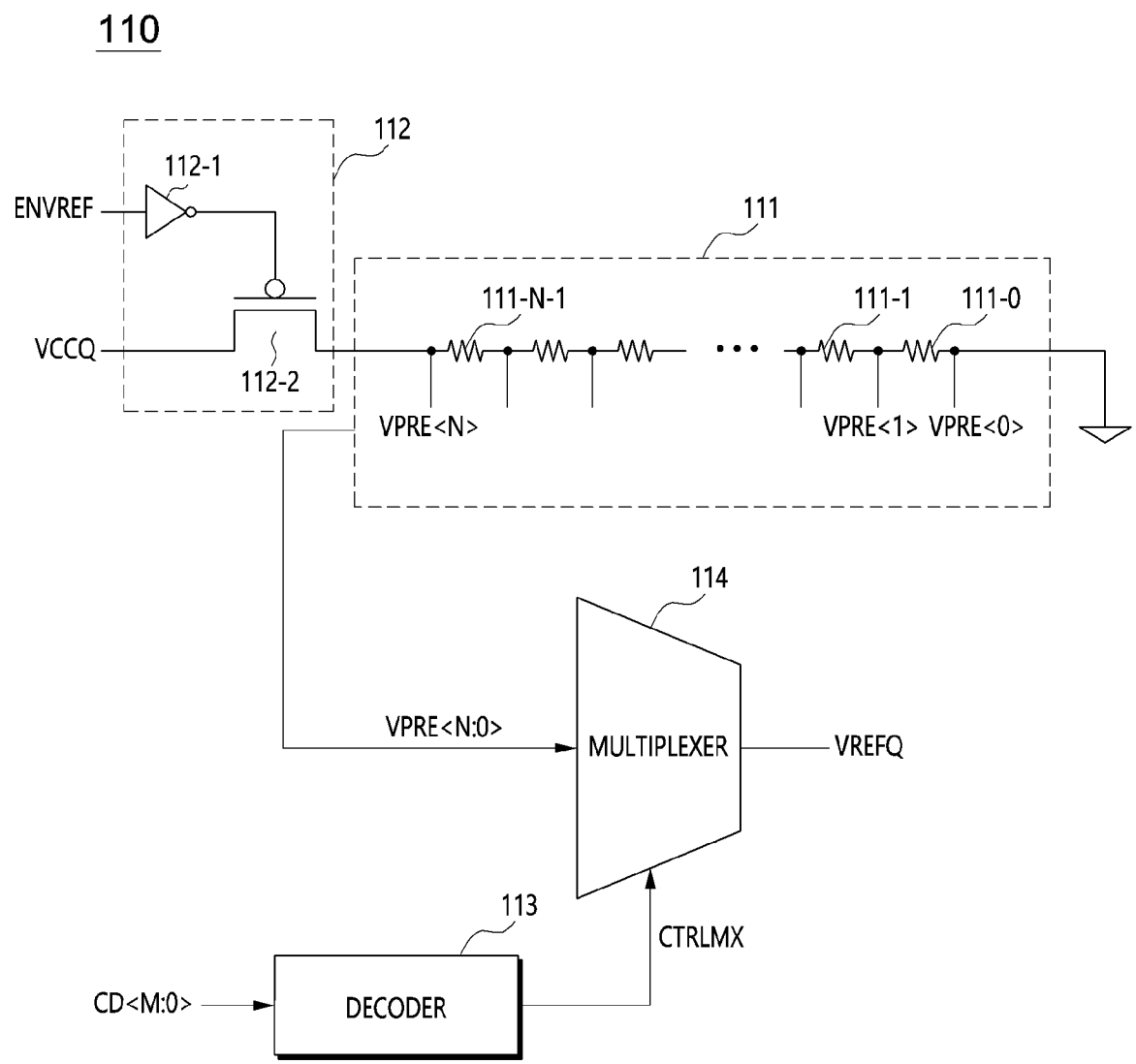
FIG. 2 is a diagram illustrating a configuration of a voltage generation unit illustrated in FIG. 1.

FIG. 2 is a diagram illustrating a configuration of the voltage generation unit 110 illustrated in FIG. 1.

Referring to FIG. 2, the voltage generation unit 110 may include a voltage division circuit 111, a switch 112, a decoder 113, and a multiplexer 114.

The voltage division circuit 111 may divide the power supply voltage VCCQ, and generate a plurality of preliminary voltages VPRE<N:0>. The voltage division circuit 111 may include a plurality of resistors 111-0 to 111-N−1 connected in series to one another. Among the plurality of resistors 111-0 to 111-N−1, one end of the resistor 111-0 may be connected to a ground terminal, and the other end of the resistor 111-N−1 may be connected to the switch 112. The plurality of preliminary voltages VPRE<N:0> may be outputted from nodes where the plurality of resistors 111-0 to 111-N−1 are connected to one another.

The switch 112 may supply or cut off the power supply voltage VCCQ to the voltage division circuit 111 in response to the voltage generation control signal ENVREF. The switch 112 may supply the power supply voltage VCCQ to the voltage division circuit 111 when the voltage generation control signal ENVREF is activated at a high level, and prevent the power supply voltage VCCQ from being supplied to the voltage division circuit 111 when the voltage generation control signal ENVREF is deactivated at a low level. In this case, although it is described as an example in the present embodiment that the voltage generation control signal ENVREF is activated at the high level and deactivated at the low level. Signal levels defining activation and deactivation are not limited, but may vary depending on a circuit design method. The switch 112 may include a logic gate 112-1 and a transistor 112-2. The logic gate 112-1 may invert the logic level of the voltage generation control signal ENVREF, and output the inverted signal. The transistor 112-2 may be turned on or off according to the output of the logic gate 112-1. In the present embodiment, because it is described as an example that the transistor 112-2 is configured as a PMOS transistor, the transistor 112-2 may be turned on when the output of the logic gate 112-1 has a low level, and be turned off when the output of the logic gate 112-1 has a high level.

The decoder 113 may decode the voltage control codes CD<M:0>, and generate a multiplexing control signal CTRLMX.

The multiplexer 114 may select one voltage from among the plurality of preliminary voltages VPRE<N:0> in response to the multiplexing control signal CTRLMX, and output the selected voltage as the reference voltage VREFQ.

Figure 3:
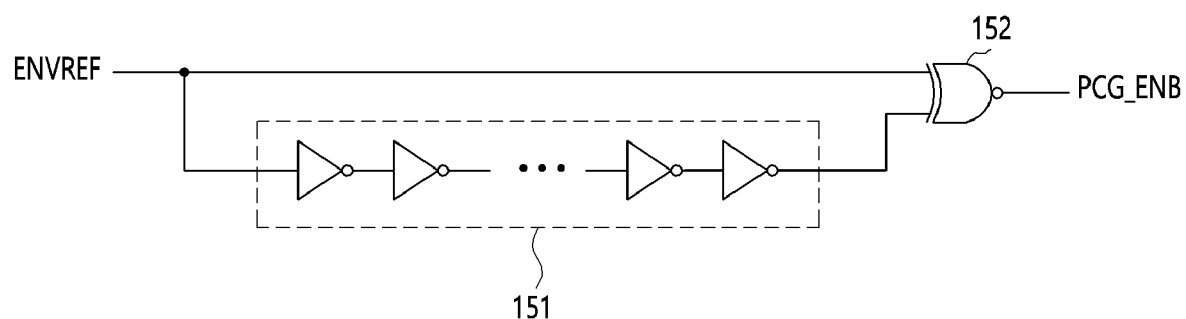
FIG. 3 is a diagram illustrating a configuration of a pulse generation unit illustrated in FIG. 1.

FIG. 3 is a diagram illustrating a configuration of the pulse generation unit 150 illustrated in FIG. 1.

Referring to FIG. 3, the pulse generation unit 150 may include an inverter chain 151 and a logic gate 152.

The inverter chain 151 may include a plurality of inverters, for example, an even number of inverters. The inverter chain 151 may delay the voltage generation control signal ENVREF, and output the delayed signal. The logic gate 152 may output, as the pre-charge control signal PCG_ENB, a pulse signal resulting from an exclusive NOR operation performed on the voltage generation control signal ENVREF and the output of the inverter chain 151.

Figure 4:
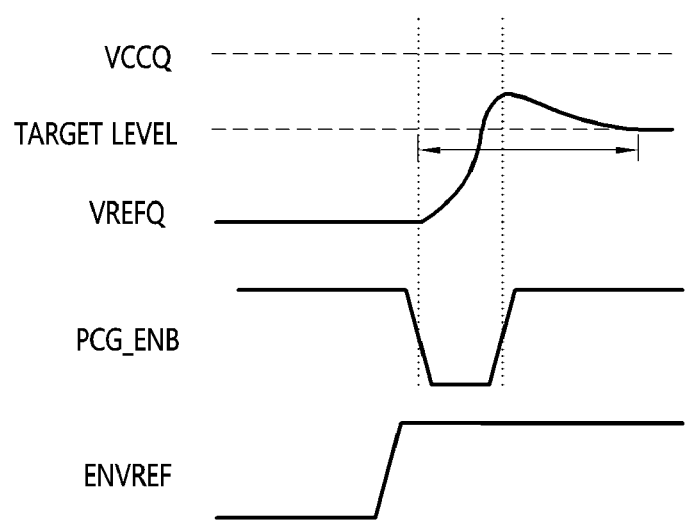
FIG. 4 is a diagram illustrating operation timing of a voltage generation circuit, according to an embodiment of the present technology.

FIG. 4 is a diagram illustrating operation timing of the voltage generation circuit 100, according to an embodiment of the present technology.

Hereinafter, an operation of the voltage generator circuit 100 according to the present embodiment is described with reference to FIGS. 1 to 4.

As the voltage generation control signal ENVREF is activated at the high level, the voltage generation unit 110 operates to generate the reference voltage VREFQ, and the pulse generation unit 150 generates the pre-charge control signal PCG_ENB.

As illustrated in FIG. 2, because the voltage generation unit 110 generates the reference voltage VREFQ through processes of dividing the power supply voltage VCCQ and selecting one of the division voltages, it may take time to raise a level of the reference voltage VREFQ to a target level.

The pre-charge unit 130 may pre-charge the voltage output node 101 with the power supply voltage VCCQ during a low level period of the pre-charge control signal PCG_ENB, thereby rapidly raising the level of the reference voltage VREFQ.

As the pre-charge control signal PCG_ENB transitions to a high level, an operation of the pre-charge unit 130 may stop, and the voltage generation unit 110 may operate in response to the voltage generation control signal ENVREF maintained at the high level, thereby stabilizing the level of the reference voltage VREFQ to the target level.

Figure 5:
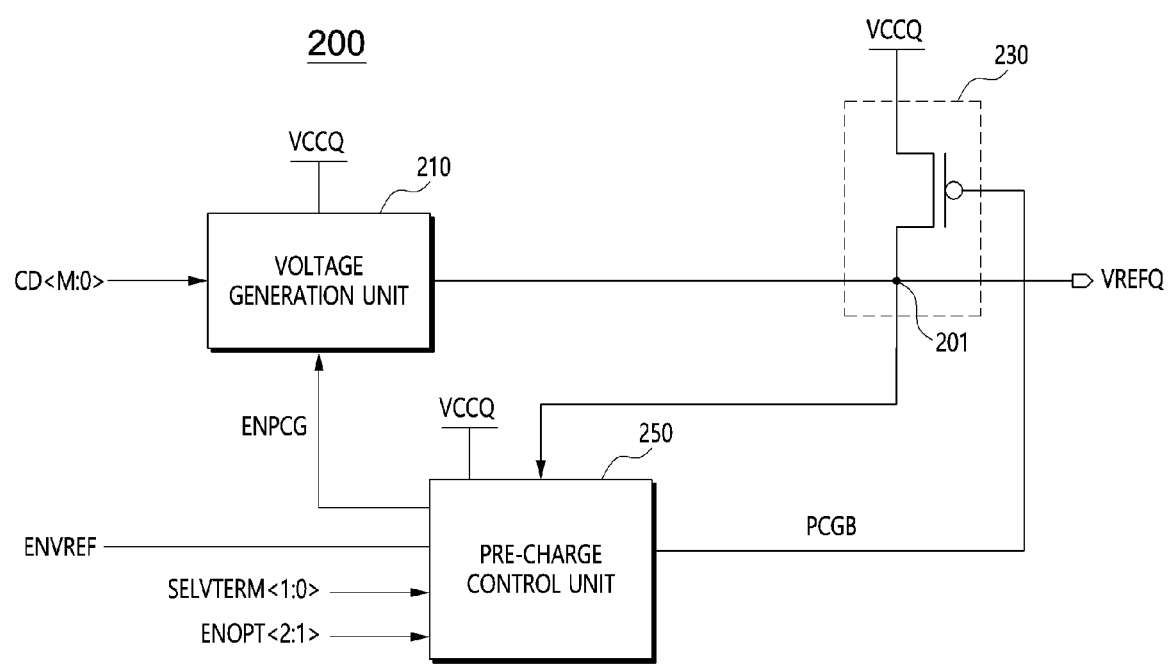
FIG. 5 is a diagram illustrating a configuration of a voltage generation circuit, according to another embodiment of the present technology.

FIG. 5 is a diagram illustrating a configuration of a voltage generation circuit 200, according to another embodiment of the present technology.

Referring to FIG. 5, the voltage generation circuit 200 may include a voltage generation unit 210, a pre-charge unit 230, and a pre-charge control unit 250.

The voltage generation unit 210 may receive a power supply voltage VCCQ, a first preliminary pre-charge control signal ENPCG, and voltage control codes CD<M:0>, and output a reference voltage VREFQ.

The voltage generation unit 210 may be configured to generate the reference voltage VREFQ by using the power supply voltage VCCQ according to the first preliminary pre-charge control signal ENPCG and the voltage control codes CD<M:0>, and to output the reference voltage VREFQ through a voltage output node 201. The voltage generation unit 210 may have the same configuration as the reference voltage generation unit 110 described with reference to FIG. 2 except for receiving the first preliminary pre-charge control signal ENPCG instead of the voltage generation control signal ENVREF.

A time required for the voltage generation unit 210 to raise a level of the reference voltage VREFQ to a target level may be referred to as a first response time. Referring to FIG. 2, the first response time may be a time required for the voltage division circuit 111 to divide the power supply voltage VCCQ and raise levels of the plurality of preliminary voltages VPRE<N:0> to corresponding target levels.

The pre-charge unit 230 may be configured to drive the voltage output node 201 to a power supply voltage VCCQ level in response to a pre-charge control signal PCGB. The pre-charge unit 230 may drive the voltage output node 201 to the power supply voltage VCCQ level during a period in which the charge control signal PCGB has a low level.

The pre-charge unit 230 may be composed of a transistor having a source terminal receiving the power supply voltage VCCQ, a drain terminal connected to the voltage output node 201, and a gate terminal receiving the pre-charge control signal PCGB.

The pre-charge control unit 250 may receive a voltage generation control signal ENVREF and a termination mode selection signals SELVTERM<1:0>, and output the pre-charge control signal PCGB. The pre-charge control unit 250 may additionally receive a first option signal ENOPT1 and a second option signal ENOPT2. A system to which the voltage generation circuit 200 according to the present embodiment is applied may perform a termination operation in one method among center-tapped termination (CTT), low-tapped termination (LTT), and high-tapped termination (HTT). The termination mode selection signals SELVTERM<1:0> may each have a value according to the predetermined termination method. For example, in the case of the center-tapped termination (CTT), the termination mode selection signals SELVTERM<1:0> may have high levels, and in the case of the low-tapped termination (LTT), the termination mode selection signals SELVTERM<1:0> may have low levels.

The pre-charge control unit 250 may be configured to generate at least one sampling voltage by using the power supply voltage VCCQ, and to generate the pre-charge control signal PCGB according to a result obtained by comparing the sampling voltage with the reference voltage VREFQ.

The pre-charge control unit 250 needs to determine the level of the reference voltage VREFQ and control a pre-charge operation. To determine the level of the reference voltage VREFQ, the level of the sampling voltage for the comparison with the reference voltage VREFQ has to be set to a target level in a short time, compared to the reference voltage VREFQ. A time required for the pre-charge control unit 250 to raise a level of the sampling voltage to the target level may be referred to as a second response time, and the second response time is shorter than the first response time of the voltage generation unit 210 described above.

Figure 6:
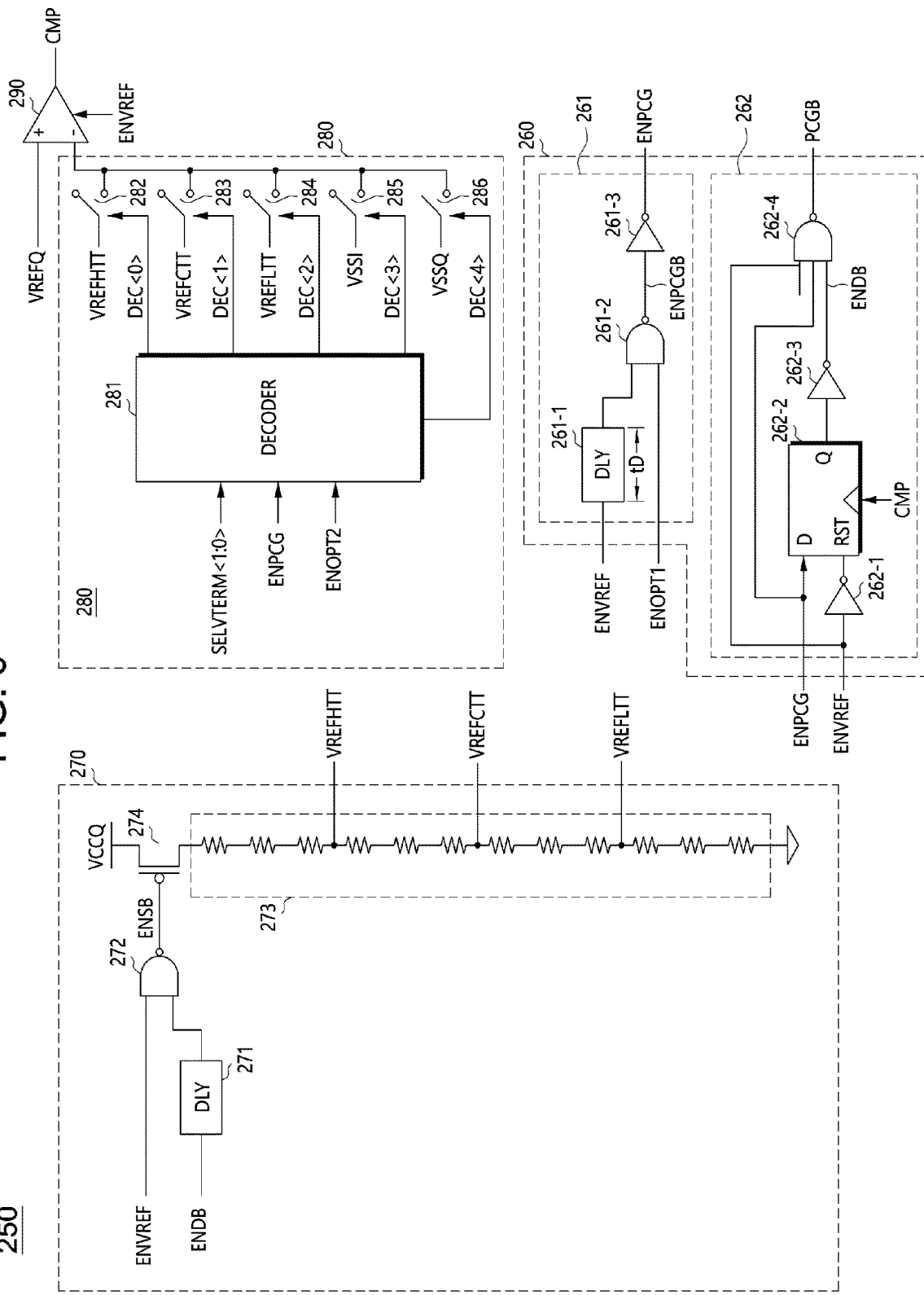
FIG. 6 is a diagram illustrating a configuration of a pre-charge control unit illustrated in FIG. 5.

FIG. 6 is a diagram illustrating a configuration of the pre-charge control unit 250 illustrated in FIG. 5, and FIG. 7 is a truth table for describing an operation of the pre-charge control unit 250 illustrated in FIG. 6.

Referring to FIG. 6, the pre-charge control unit 250 may include a control logic unit 260, a sampling voltage generation unit 270, a voltage selection unit 280, and a comparator 290. For some embodiments, the word "unit" may refer to one or more electronic circuits.

The control logic unit 260 may receive the voltage generation control signal ENVREF and the first option signal ENOPT1, and output the pre-charge control signal PCGB.

The control logic unit 260 may include a first control logic unit 261 and a second control logic unit 262. The first control logic unit 261 may receive the voltage generation control signal ENVREF and the first option signal ENOPT1, and generate the first preliminary pre-charge control signal ENPCG and an inverted first preliminary pre-charge control signal ENPCGB. A value of the first option signal ENOPT1 may be set to an external test mode or a fuse option. The pre-charge control unit 250 may be deactivated by setting the first option signal ENOPT1 to a low level.

The first control logic unit 261 may include a delayer 261-1, a first logic gate 261-2, and a second logic gate 261-3. The delayer 261-1 may delay the voltage generation control signal ENVREF by a first predetermined time tD, and output the delayed signal. The first predetermined time tD of the delayer 261-1 may be set to have a greater value than a voltage stabilization time tST of the sampling voltage generation unit 270. Prior to further description, the voltage stabilization time tST may be a time required for the sampling voltage generation unit 270 to raise a level of at least one sampling voltage to a target level or higher. The first logic gate 261-2 may output, as the inverted first preliminary pre-charge control signal ENPCGB, a result obtained by performing a NAND operation on the output of the delayer 261-1 and the first option signal ENOPT1. The second logic gate 261-3 may output, as the first preliminary pre-charge control signal ENPCG, a result obtained by inverting the inverted first preliminary pre-charge control signal ENPCGB. The pre-charge control unit 250 of FIG. 6 is merely an embodiment to which the first option signal ENOPT1 is applied, and it is possible to configure the pre-charge control unit 250 not to use the first option signal ENOPT1. Moreover, when the first option signal ENOPT1 is not used, it is also possible to configure the pre-charge control unit 250 only with the delayer 261-1 that delays the voltage generation control signal ENVREF by the first predetermined time tD and outputs the delayed signal as the first preliminary pre-charge control signal ENPCG.

The second control logic unit 262 may receive the voltage generation control signal ENVREF, the first preliminary pre-charge control signal ENPCG, and a comparison signal CMP, and output a second preliminary pre-charge control signal ENDB and the pre-charge control signal PCGB. The second control logic unit 262 may include a first logic gate 262-1, a flip-flop 262-2, a second logic gate 262-3, and a third logic gate 262-4. The first logic gate 262-1 may invert the voltage generation control signal ENVREF, and output the inverted signal. The flip-flop 262-2 may receive the first preliminary pre-charge control signal ENPCG through an input terminal D thereof, receive the output of the first logic gate 262-1 through a reset terminal RST thereof, and receive the comparison signal CMP through a clock terminal thereof. The flip-flop 262-2 may latch the first preliminary pre-charge control signal ENPCG, and output the latched signal through an output terminal Q thereof when the comparison signal CMP has a high level. The flip-flop 262-2 may reset the output terminal Q when the output of the first logic gate 262-1 has a high level. The second logic gate 262-3 may output a result obtained by inverting the output of the flip-flop 262-2 as the second preliminary pre-charge control signal ENDB. The third logic gate 262-4 may output, as the pre-charge control signal PCGB, a result obtained by performing the NAND operation on the voltage generation control signal ENVREF, the first preliminary pre-charge control signal ENPCG, and the second preliminary pre-charge control signal ENDB.

The sampling voltage generation unit 270 may generate at least one sampling voltage, for example, a first sampling voltage VREFCTT, a second sampling voltage VREFLTT, and a third sampling voltage VREFHTT, by using the power supply voltage VCCQ according to the voltage generation control signal ENVREF and the second preliminary pre-charge control signal ENDB.

The sampling voltage generation unit 270 may include a delayer 271, a logic gate 272, a voltage division circuit 273, and a driver 274.

The delayer 271 may delay the second preliminary pre-charge control signal ENDB, and output the delayed signal.

The logic gate 272 may output, as a sampling voltage control signal ENSB, a result obtained by performing the NAND operation on the voltage generation control signal ENVREF and the output of the delayer 271.

The voltage division circuit 273 may divide the power supply voltage VCCQ, and generate at least one sampling voltage, that is, the first sampling voltage VREFCTT, the second sampling voltage VREFLTT, and the third sampling voltage VREFHTT. The voltage division circuit 273 may include a plurality of resistors for dividing the power supply voltage VCCQ. Among nodes to which the plurality of resistors are connected, the first sampling voltage VREFCTT may be outputted through one node, the second sampling voltage VREFLTT may be outputted through another node, and the third sampling voltage VREFHTT may be outputted through another node. The first sampling voltage VREFCTT may be outputted through a node to which a center tap of the voltage division circuit 273 is connected, so as to have a voltage level corresponding to a case where the termination method of the system to which the voltage generation circuit 200 according to the present embodiment is applied is the center-tapped termination (CTT), for example, a level corresponding to half of the power supply voltage VCCQ. The second sampling voltage VREFLTT may be outputted through a node to which a low tap of the voltage division circuit 273 is connected, to have a voltage level corresponding to a case where the termination method is the low-tapped termination (LTT), for example, a level corresponding to ¼ of the power supply voltage VCCQ. The third sampling voltage VREFHTT may be outputted through a node to which a high tap of the voltage division circuit 273 is connected, to have a voltage level corresponding to a case where the termination method is the high-tapped termination (HTT), for example, a level corresponding to ¾ of the power supply voltage VCCQ.

The driver 274 may apply the power supply voltage VCCQ to the voltage division circuit 273 according to the sampling voltage control signal ENSB. The driver 274 may apply the power supply voltage VCCQ to the voltage division circuit 273 while the sampling voltage control signal ENSB has a low level. The driver 274 may be composed of a transistor having a source terminal receiving the power supply voltage VCCQ, a drain terminal connected to the voltage division circuit 273, and a gate terminal receiving the sampling voltage control signal ENSB.

The voltage selection unit 280 may select and output one of the first sampling voltage VREFCTT, the second sampling voltage VREFLTT, the third sampling voltage VREFHTT, a ground voltage VSSI, and the power supply voltage VCCQ in response to the first preliminary pre-charge control signal ENPCG, the termination mode selection signals SELVTERM<1:0>, and the second option signal ENOPT2. The termination mode selection signals SELVTERM<1:0> may be used to select a voltage according to a currently selected termination mode (HTT, CTT or LTT) from among the first sampling voltage VREFCTT, the second sampling voltage VREFLTT, and the third sampling voltage VREFHTT. The second option signal ENOPT2 may be used as a signal for selecting one of the ground voltage VSSI and the power supply voltage VCCQ when the first preliminary pre-charge control signal ENPCG is deactivated at a low level.

The voltage selection unit 280 may include a decoder 281 and a plurality of switches 282 to 286. The decoder 281 may output decoding signals DEC<4:0> generated by decoding the first preliminary pre-charge control signal ENPCG, the termination mode selection signals SELVTERM<1:0>, and the second option signal ENOPT2. The decoder 281 may operate, for example, as shown in the truth table of FIG. 7.

Referring to FIG. 7, when the first preliminary pre-charge control signal ENPCG has a high level "1," the decoder 281 may generate the decoding signals DEC<4:0> so that one of the first sampling voltage VREFCTT, the second sampling voltage VREFLTT, and the third sampling voltage VREFHTT is selected according to values of the termination mode selection signals SELVTERM<1:0>, regardless of a value of the second option signal ENOPT2. When the termination method is the high-tapped termination (HTT), the termination mode selection signals SELVTERM<1:0> may be "10" or "11," when the termination method is the center-tapped termination (CTT), the termination mode selection signals SELVTERM<1:0> may be "01," and when the termination method is the low-tapped termination (LTT), the termination mode selection signals SELVTERM<1:0> may be "00."

The decoder 281 may output only the decoding signal DEC<0> among the decoding signals DEC<4:0> at the high level "1" when the first preliminary pre-charge control signal ENPCG has the high level "1," and the termination mode selection signal SELVTERM<1> has the high level "1." The decoder 281 may output only the decoding signal DEC<1> among the decoding signals DEC<4:0> at the high level "1" when the first preliminary pre-charge control signal ENPCG has the high level "1," and the termination mode selection signal SELVTERM<0> has the high level "1." The decoder 281 may output only the decoding signal DEC<2> among the decoding signals DEC<4:0> at the high level "1" when the first preliminary pre-charge control signal ENPCG has the high level "1," and the termination mode selection signals SELVTERM<1:0> all have a low level "0."

When the first preliminary pre-charge control signal ENPCG has the low level "0," the decoder 281 may generate the decoding signals DEC<4:0> so that one of the ground voltage VSSI and the power supply voltage VCCQ is selected according to a value of the second option signal ENOPT2, regardless of values of the termination mode selection signals SELVTERM<1:0>. When the first preliminary pre-charge control signal ENPCG has the low level "0," and the second option signal ENOPT2 has the low level "0," the decoder 281 may output only the decoding signal DEC<3> among the decoding signals DEC<4:0> at the high level "1." When the first preliminary pre-charge control signal ENPCG has the low level "0," and the second option signal ENOPT2 has the high level "1," the decoder 281 may output only the decoding signal DEC<4> among the decoding signals DEC<4:0> at the high level "1."

The plurality of switches 282 to 286 may provide the comparator 290 with one of the first sampling voltage VREFCTT, the second sampling voltage VREFLTT, the third sampling voltage VREFHTT, the ground voltage VSSI, and the power supply voltage VCCQ in response to the decoding signals DEC<4:0>. The first switch 282 may provide the comparator 290 with the third sampling voltage VREFHTT when the decoding signal DEC<0> has the high level "1." The second switch 283 may provide the comparator 290 with the first sampling voltage VREFCTT when the decoding signal DEC<1> has the high level "1." The third switch 284 may provide the comparator 290 with the second sampling voltage VREFLTT when the decoding signal DEC<2> has the high level "1." The fourth switch 285 may provide the comparator 290 with the ground voltage VSSI when the decoding signal DEC<3> has the high level "1." The fifth switch 286 may provide the comparator 290 with the power supply voltage VCCQ when the decoding signal DEC<4> has the high level "1."

The comparator 290 may compare the level of the reference voltage VREFQ with a level of the voltage outputted from the voltage selection unit 280, and generate the comparison signal CMP. The comparator 290 may generate the comparison signal CMP at a high level when the level of the reference voltage VREFQ is higher than the level of the voltage outputted from the voltage selection unit 280. The comparator 290 may be configured as a static type to generate a stable output corresponding to variations in process, voltage, and temperature (PVT).

Figure 8:
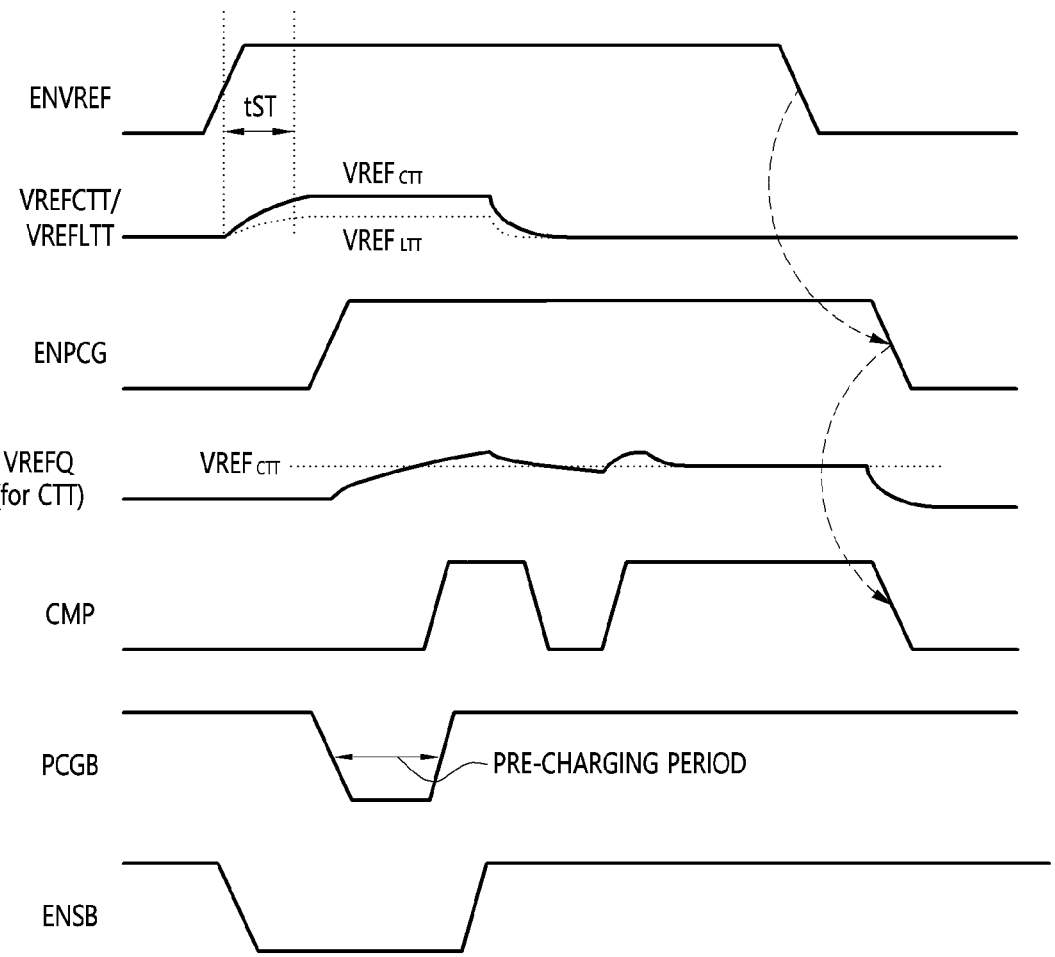
FIG. 8 is a diagram illustrating operation timing of a voltage generation circuit, according to another embodiment of the present technology.

FIG. 8 is a diagram illustrating operation timing of the voltage generation circuit 200, according to another embodiment of the present technology.

Hereinafter, an operation of the voltage generation circuit 200 according to the present embodiment is described with reference to FIGS. 5 to 8.

As the voltage generation control signal ENVREF has a high level, the pre-charge control unit 250 may operate so that each of the first sampling voltage VREFCTT, the second sampling voltage VREFLTT, and the third sampling voltage VREFHTT may rise to the target level.

Meanwhile, as the voltage generation control signal ENVREF has the high level, the voltage generation unit 210 may operate so that the level of the reference voltage VREFQ may rise.

In this case, as described above, the second response time required for the pre-charge control unit 250 to raise the levels of the first sampling voltage VREFCTT, the second sampling voltage VREFLTT, and the third sampling voltage VREFHTT to respective target levels is shorter than the first response time required for the voltage generation unit 210 to raise the level of the reference voltage VREFQ to the target level. Accordingly, the levels of the first sampling voltage VREFCTT, the second sampling voltage VREFLTT, and the third sampling voltage VREFHTT may be stabilized in a short time, as compared with the reference voltage VREFQ.

After the voltage generation control signal ENVREF has the high level, and the first predetermined time tD of the delayer 261-1 elapses, the first preliminary pre-charge control signal ENPCG may have the high level.

As the first preliminary pre-charge control signal ENPCG has the high level, the pre-charge control signal PCGB may have a low level.

As the pre-charge control signal PCGB has the low level, the pre-charge unit 230 pre-charges the voltage output node 201 to the power supply voltage VCCQ level, and the level of the reference voltage VREFQ rises accordingly.

Assuming that the termination method of the system to which the voltage generator circuit 200 according to the present embodiment is applied is the center-tapped termination (CTT), the termination mode selection signals SELVTERM<1:0> is "01." Because the termination mode selection signals SELVTERM<1:0> is "01," the voltage selection unit 280 provides the comparator 290 with the first sampling voltage VREFCTT.

The comparator 290 outputs the comparison signal CMP at a low level when the level of the reference voltage VREFQ is lower than that of the first sampling voltage VREFCTT. The comparator 290 outputs the comparison signal CMP at a high level when the level of the reference voltage VREFQ rises and becomes higher than that of the first sampling voltage VREFCTT.

As the comparison signal CMP has the high level, the second preliminary pre-charge control signal ENDB transitions to a low level, and accordingly, the pre-charge control signal PCGB transitions to a high level.

As the pre-charge control signal PCGB transitions to the high level, the pre-charge operation of the pre-charge unit 230 stops.

The second preliminary pre-charge control signal ENDB transitions to the low level, and the sampling voltage control signal ENSB transitions to a high level after a delay time of the delayer 271.

As the sampling voltage control signal ENSB transitions to the high level, the driver 274 of the pre-charge control unit 250 may prevent the voltage division circuit 273 and the power supply voltage VCCQ from being connected to each other, and thus the operation of generating the first sampling voltage VREFCTT, the second sampling voltage VREFLTT, and the third sampling voltage VREFHTT may stop.

The reason why the circuit is configured so that the sampling voltage control signal ENSB transitions at a later time as compared with the second preliminary pre-charge control signal ENDB is to maintain the first sampling voltage VREFCTT, the second sampling voltage VREFLTT, and the third sampling voltage VREFHTT at stable levels until the pre-charge operation of the pre-charge unit 230 stops.

Figure 9:
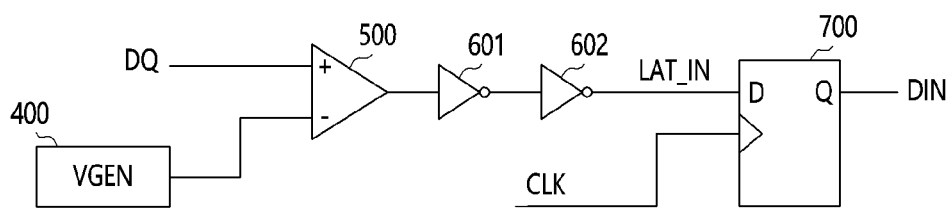
FIG. 9 is a diagram illustrating a configuration of a receiver circuit, according to an embodiment of the present technology.

FIG. 9 is a diagram illustrating a configuration of a receiver circuit 300, according to an embodiment of the present technology.

Referring to FIG. 9, the receiver circuit 300 according to the present embodiment may include a voltage generation circuit 400, a comparator 500, first and second logic gates 601 and 602, and a flip-flop 700.

The voltage generation circuit 400 may be configured to generate a reference voltage, and be configured in the same manner as the voltage generation circuit 200 described with reference to FIGS. 5 to 8.

The comparator 500 may output a result obtained by comparing a signal inputted through an input/output pad DQ of a semiconductor device with the reference voltage.

The first and second logic gates 601 and 602 may buffer the output of the comparator 500, and generate an output signal LAT_IN.

The flip-flop 700 may latch and output the output signal LAT_IN of the second logic gate 602 according to a clock signal CLK, and generate a data signal DIN.

In this case, the receiver circuit 300 of FIG. 9 has an advantage in terms of circuit area as a single-ended method over a differential method, but has a disadvantage of being vulnerable to noise. Therefore, a stable reference voltage is required to accurately receive a signal inputted from the outside of the semiconductor device.

Because the voltage generation circuit 400 is insensitive to variations in PVT, and is able to generate the stable reference voltage, operational reliability of the receiver circuit 300, particularly, the single-ended receiver circuit, may be improved. In addition, as operation-related latency of a system to which the receiver circuit 300 is applied, for example, a semiconductor memory device is reduced, an operation timing margin may increase.

A person skilled in the art to which the present technology pertains will understand that the present technology may be carried out in other specific forms without changing its technical spirit or essential features. Therefore, it should be understood that the embodiments described above are illustrative in all aspects, not limitative. The scope of the present technology is defined by the claims described below rather than the detailed description, and it should be construed that the meaning and scope of the claims and all changes or modified forms derived from the equivalent concept thereof are included in the scope of the present technology.

What is claimed is:

1. A voltage generation circuit comprising:
   a voltage generation unit configured to generate a reference voltage using a power supply voltage and output the reference voltage through a voltage output node;
   a pre-charge unit configured to drive the voltage output node using the power supply voltage in response to a pre-charge control signal; and
   a pre-charge control unit configured to generate at least one sampling voltage using the power supply voltage and generate the pre-charge control signal according to a result obtained by comparing the at least one sampling voltage with the reference voltage.

2. The voltage generation circuit according to claim 1, wherein the pre-charge control unit is configured such that a second response time required for the voltage generation unit to raise a level of the at least one sampling voltage to a corresponding target level of the at least one sampling voltage is shorter than a first response time required for the voltage generation unit to raise a level of the reference voltage to a corresponding target level of the reference voltage.

3. The voltage generation circuit according to claim 1, wherein the voltage generation unit includes:
   a voltage division circuit configured to divide the power supply voltage and generate a plurality of preliminary voltages;
   a decoder configured to decode a voltage control code and generate a multiplexing control signal; and
   a multiplexer configured to select one voltage from among the plurality of preliminary voltages in response to the multiplexing control signal and output the selected voltage as the reference voltage.

4. The voltage generation circuit according to claim 3, further comprising a switch configured to supply or cut off the power supply voltage to the voltage division circuit in response to a voltage generation control signal.

5. The voltage generation circuit according to claim 1, wherein the pre-charge control unit includes:
   a control logic unit configured to generate the pre-charge control signal according to a voltage generation control signal and a comparison signal;
   a sampling voltage generation unit configured to generate the at least one sampling voltage using the power supply voltage according to the voltage generation control signal; and
   a comparator configured to compare a level of the reference voltage with a level of the at least one sampling voltage and generate the comparison signal.

6. The voltage generation circuit according to claim 5, further comprising a voltage selection unit configured to select one voltage from the at least one sampling voltage according to a termination mode selection signal and provide the comparator with the selected voltage.

7. A voltage generation circuit comprising:
   a voltage generation unit including a first voltage division circuit configured to divide a power supply voltage and generate a plurality of preliminary voltages, the voltage generation unit configured to output one of the plurality of preliminary voltages as a reference voltage through a voltage output node according to a voltage generation control signal and a voltage control code;
   a control logic unit configured to generate a pre-charge control signal according to the voltage generation control signal and a comparison signal;
   a pre-charge unit configured to pre-charge the voltage output node to a power supply voltage level in response to the pre-charge control signal;
   a second voltage division circuit configured to divide the power supply voltage and generate at least one sampling voltage; and
   a comparator configured to compare the reference voltage with the at least one sampling voltage and generate the comparison signal.

8. The voltage generation circuit according to claim 7, wherein the second voltage division circuit is configured such that a second response time required for the first voltage division circuit to raise a level of the at least one sampling voltage to a corresponding target level of the at least one sampling voltage is shorter than a time required for the first voltage division circuit to raise levels of the plurality of preliminary voltages to corresponding target levels of the plurality of preliminary voltages.

9. The voltage generation circuit according to claim 7, wherein the voltage generation unit further includes:
   a decoder configured to decode the voltage control code and generate a multiplexing control signal; and
   a multiplexer configured to select one voltage from among the plurality of preliminary voltages in response to the multiplexing control signal and output the selected voltage as the reference voltage.

10. The voltage generation circuit according to claim 7, wherein the control logic unit includes:
    a first control logic unit configured to generate a first preliminary pre-charge control signal according to the voltage generation control signal; and
    a second control logic unit configured to generate the pre-charge control signal according to the voltage generation control signal, the first preliminary pre-charge control signal, and the comparison signal.

11. The voltage generation circuit according to claim 7, further comprising a voltage selection unit configured to select one voltage from the at least one sampling voltage according to a termination mode selection signal and provide the comparator with the selected voltage.

12. A pre-charge control circuit comprising:
    a pre-charge unit configured to pre-charge a voltage output node to which an internal voltage is applied with a power supply voltage in response to a pre-charge control signal;
    a control logic unit configured to generate a first preliminary pre-charge control signal according to a voltage generation control signal and generate the pre-charge control signal according to the voltage generation control signal, the first preliminary pre-charge control signal, and a comparison signal;
    a sampling voltage generation unit configured to divide the power supply voltage and generate at least one sampling voltage; and a comparator configured to compare the internal voltage with the at least one sampling voltage and generate the comparison signal.

13. The pre-charge control circuit according to claim 12, further comprising a voltage selection unit configured to select one of a first sampling voltage, a second sampling voltage, and a third sampling voltage in response to the first preliminary pre-charge control signal and a termination mode selection signal and output the selected voltage.

14. The pre-charge control circuit according to claim 13, wherein the termination mode selection signal has different values in the cases of center-tapped termination, low-tapped termination, and high-tapped termination.

15. The pre-charge control circuit according to claim 12, wherein the control logic unit is configured to delay the voltage generation control signal by a first predetermined time and output the delayed signal as the first preliminary pre-charge control signal.

16. The pre-charge control circuit according to claim 15, wherein the first predetermined time is set to be longer than a time required for the sampling voltage generation unit to raise a level of the at least one sampling voltage to a target level or higher.

17. The pre-charge control circuit according to claim 12, wherein the control logic unit includes:

a first logic gate configured to invert the voltage generation control signal and output the inverted signal;
a flip-flop configured to latch the first preliminary pre-charge control signal according to the comparison signal and output the latched signal;
a second logic gate configured to output a result obtained by inverting the output of the flip-flop as a second preliminary pre-charge control signal; and
a third logic gate configured to output a result obtained by performing a logical operation on the voltage generation control signal, the first preliminary pre-charge control signal, and the second preliminary pre-charge control signal as the pre-charge control signal.

18. The pre-charge control circuit according to claim 12, wherein the sampling voltage generation unit includes:

a voltage division circuit configured to divide the power supply voltage and generate the at least one sampling voltage;
a logic gate configured to generate a sampling voltage control signal according to the voltage generation control signal; and
a driver configured to apply the power supply voltage to the voltage division circuit according to the sampling voltage control signal.

* * * * *